United States Patent
Shi et al.

(10) Patent No.: US 11,475,200 B2
(45) Date of Patent: Oct. 18, 2022

(54) CIRCUIT LAYOUT TECHNIQUES

(71) Applicant: Arm Limited, Cambridge (GB)

(72) Inventors: Yulin Shi, Austin, TX (US); Vincent Philippe Schuppe, Austin, TX (US); Ettore Amirante, Nice (FR)

(73) Assignee: Arm Limited, Cambridge (GB)

( * ) Notice: Subject to any disclaimer, the term of this patent is extended or adjusted under 35 U.S.C. 154(b) by 0 days.

(21) Appl. No.: 16/893,378

(22) Filed: Jun. 4, 2020

(65) Prior Publication Data

US 2021/0383050 A1 Dec. 9, 2021

(51) Int. Cl.
*G06F 30/398* (2020.01)
*G06F 30/3953* (2020.01)

(52) U.S. Cl.
CPC ........ *G06F 30/398* (2020.01); *G06F 30/3953* (2020.01)

(58) Field of Classification Search
CPC .................................................... G06F 30/398
USPC .......................................................... 716/111
See application file for complete search history.

(56) References Cited

U.S. PATENT DOCUMENTS

2018/0018420 A1* 1/2018 Cline ................ H01L 21/76892

* cited by examiner

*Primary Examiner* — Eric D Lee
(74) *Attorney, Agent, or Firm* — Pramudji Law Group PLLC; Ari Pramudji

(57) ABSTRACT

Various implementations described herein are directed to an apparatus having a processor and memory having instructions stored thereon that, when executed by the processor, cause the processor to identify conductive paths in a physical layout of an integrated circuit having nodal features that define a connective structure of the integrated circuit. The instructions may cause the processor to traverse the conductive paths to detect valid metals and redundant metals. The valid metals may refer to valid conductive paths between the nodal features that conjoin the nodal features. The redundant metals may refer to unused conductive paths that provide disjointed paths from the nodal features. The instructions may cause the processor to indicate the valid metals as marked with a first indicator and to indicate the redundant metals as unmarked with a second indicator that is different than the first indicator.

20 Claims, 13 Drawing Sheets

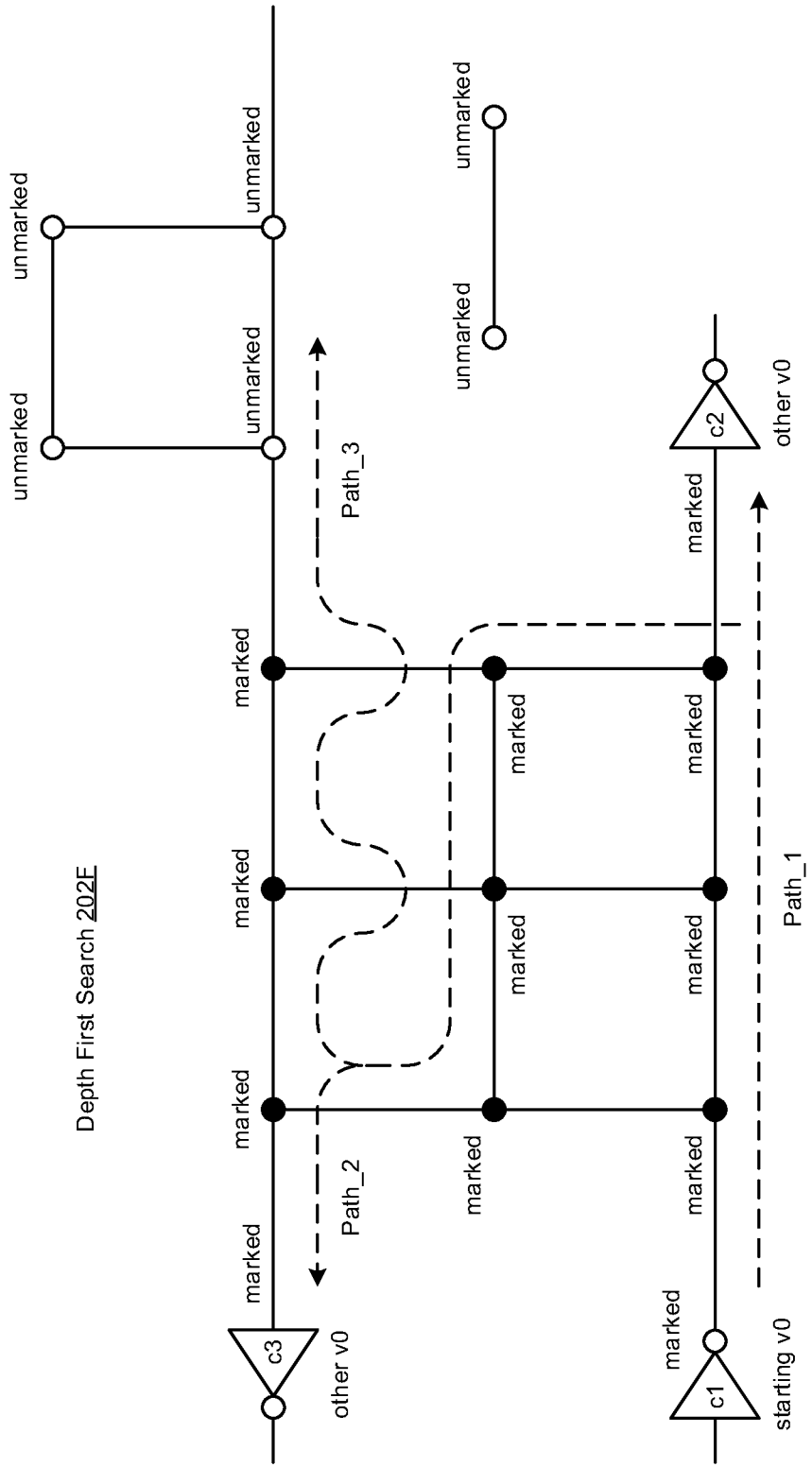

CIRCUIT LAYOUT TECHNIQUES

BACKGROUND

This section is intended to provide information relevant to understanding the various technologies described herein. As the section's title implies, this is a discussion of related art that should in no way imply that it is prior art. Generally, related art may or may not be considered prior art. It should therefore be understood that any statement in this section should be read in this light, and not as any admission of prior art.

In modern circuit designs, some layout engineers manually identify and locate redundant metals, floating metals and elongated unused metals. There can be a hundred thousand or even millions of metals in conventional memory layouts. As such, since there are substantial amounts of metals in conventional circuit designs, layout engineers cannot manually find all of the redundant metals, floating metals and/or unused metals in a typical layout design, and as such, many of the redundant metals, floating metals and elongated unused metals are left in the layouts of conventional circuit designs. Thus, there exists a need to improve the layout efficiency of conventional circuit designs.

BRIEF DESCRIPTION OF THE DRAWINGS

Implementations of various techniques are described herein with reference to the accompanying drawings. It should be understood, however, that the accompanying drawings illustrate only various implementations described herein and are not meant to limit embodiments of various techniques described herein.

FIGS. 2A-2G illustrate various design diagrams of circuit layout architecture in accordance with various implementations described herein.

DETAILED DESCRIPTION

Figure 1:
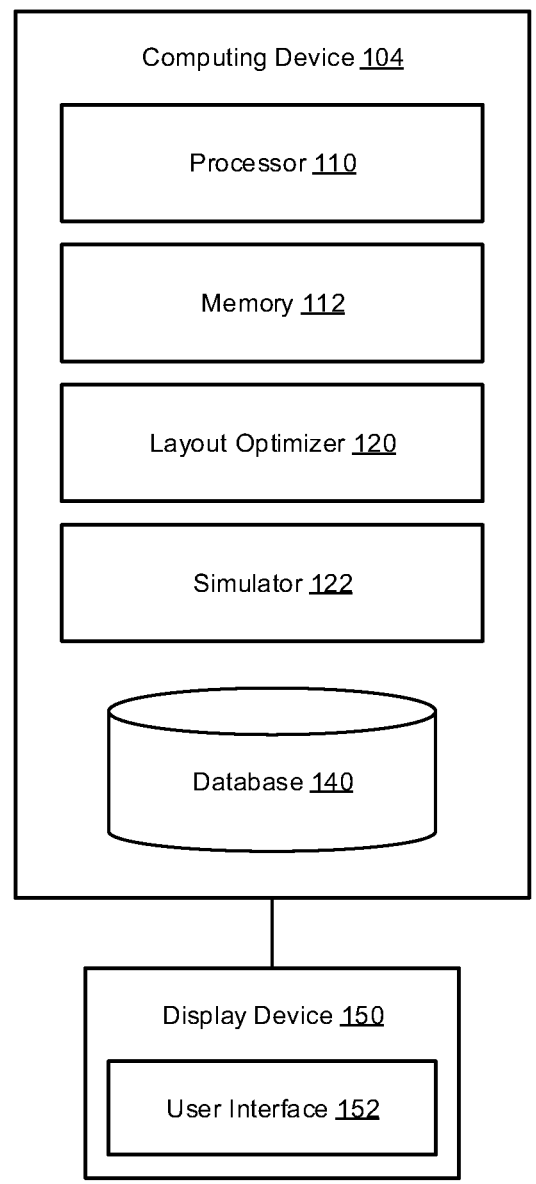
FIG. 1 illustrates a diagram of a computing system for providing circuit layout schemes and techniques in accordance with implementations described herein.

Various implementations described herein are related to circuit layout schemes and techniques for physical design applications, such as, e.g., a layout optimization tool that may operate as a layout edit assistant to detect and/or remove redundant and floating metals along with long metal-via extensions for custom layout designs. For instance, the various schemes and techniques described herein may be used to detect unused metals in a short time (e.g., a few seconds), and a visual representation of various solutions may be provided in a displayed circuit layout view. The layout optimization tool may assist the layout engineers with removal or "clean-up" of unused metals to enable non-default route (NDR) for improved power, performance and area (PPA) optimization. In this manner, the various schemes and techniques described herein may be used to improve layout quality and also save human efforts on layout editing. Also, in some implementations, the layout optimization tool and methods may be used to detect various redundant metals (e.g., floating metals, unused metals, and similar) and also for detecting various unused disjointed metal wires, such as, e.g., long metal-via extensions and similar. Moreover, in some implementations, the layout optimization tool and methods may be used to provide various visual representations as a viewable overlook that marks (or highlights) the redundant unused metals along with long metal-via extensions.

The various schemes and techniques described herein may provide for a method to build a metal/via graph and a method to traverse the metal/via graph. In some instances, the various methods described herein may provide for identifying conductive paths (e.g., metal wires and segments) and nodal features (e.g., circuit components and vias) that are coupled together. The various methods described herein may also provide for traversing the conductive paths from a lowest via (e.g., a starting via) to one or more other vias (e.g., one or more ending vias). The various methods described herein may also provide for marking (or highlighting) the metals and vias between the vias, wherein marked metals and/or vias may be indicated as valid, and wherein unmarked metals and vias may be indicated as invalid (e.g., redundant, floating, unused, or similar).

Also, the various schemes and techniques described herein may provide for a method to process both single-directional metals and also bi-directional metals. In some instances, long metal-via extensions may refer to a metal-via extension that is longer than an extension parameter or requirement, and these metal-via extensions may not be used or needed in circuit layout designs. The various methods described herein may provide for checking conductive paths and metals in a circuit layout architecture to identify and locate convex u-shaped metals in the conductive paths and also identify and locate a closest via and a closest turning point along the conductive paths. In some instances, if the distance to a closest via is longer than the extension parameter, then a long metal-via extension is determined to be found (e.g., if there is no via along the metal, then the distance may be considered as infinite). The various methods described herein may provide for repeating these discovery operations until no more long metal-via extensions are found.

Various implementations of improved circuit layout schemes and techniques will now be described in detail herein with reference to FIGS. 1-4B.

FIG. 1 illustrates a diagram of a computing system 100 for providing circuit layout techniques in accordance with implementations described herein.

In reference to FIG. 1, the computing system 100 may be associated with at least one computing device 104 that is implemented as a special purpose apparatus for providing various circuit layout schemes and techniques in physical circuit layout design, as described herein. In some instances, the computing device 104 may include standard element(s) and/or component(s), including at least one processor(s) 110, memory 112 (e.g., non-transitory computer-readable storage medium), one or more database(s) 140, power, peripherals, and various other computing elements and/or components that may not be shown in FIG. 1. The computing device 104 may include instructions recorded or stored on the non-transitory computer-readable medium 112 that are executable by the at least one processor 110. The computing device 104 may be associated with a display device 150 (e.g., a monitor or other display) that may be used to provide a user interface (UI) 152, such as, e.g., a graphical user interface (GUI). In some instances, the UI 152 may be used to receive various parameters and/or preferences from a user for managing, operating, and/or controlling the computing device 104. Thus, the computing device 104 may include the display device 150 for providing various output to a user, and the display device 150 may include the UI 152 for receiving input from the user.

In some implementations, as shown in FIG. 1, the computing device 104 may include a layout optimizer 120 that is configured to cause the at least one processor 110 to implement one or more or all circuit layout design schemes and techniques described herein in reference to FIGS. 2-4B, including implementing integrated circuitry in physical layout design. In various implementations, the layout optimizer 120 may be implemented in hardware and/or software applications. For instance, if implemented in software, the layout optimizer 120 may be stored in memory 112 and/or database 140. Also, in some instances, if implemented in hardware, the layout optimizer 120 may refer to a separate processing component configured to interface with the processor 110.

In some instances, the layout optimizer 120 may be configured to cause the at least one processor 110 to perform various operations, as provided herein in reference to circuit layout schemes and techniques described in FIGS. 2-4B. The memory 112 may have stored thereon instructions that, when executed by the processor 110, cause the processor 110 to perform one or more or all of the following operations.

For instance, the layout optimizer 120 may be configured to cause the at least one processor 110 to identify conductive paths in a physical layout of an integrated circuit having nodal features that define a connective structure of the integrated circuit. In some instances, the conductive paths may include wires and vias. In some instances, the wires may include conductive metal segments that connect the nodal features, and the vias may include long metal-via extensions that protrude from the nodal features. Also, in some instances, the nodal features may include circuit components and nodes, and the nodes may conjoin the conductive paths disposed between the circuit components.

In some instances, the layout optimizer 120 may be configured to cause the at least one processor 110 to traverse the conductive paths so as to detect valid metals and redundant metals. The valid metals may refer to valid conductive paths between the nodal features that conjoin the nodal features, and the redundant metals may refer to unused conductive paths that provide disjointed paths from the nodal features. In some instances, the disjointed paths may refer to conductive paths that extend (or protrude) from at least one nodal feature of the nodal features, and the disjointed paths are uncoupled to at least one other nodal feature of the nodal features.

In some instances, the layout optimizer 120 may be configured to cause the at least one processor 110 to indicate the valid metals as marked with a first indicator. Also, the layout optimizer 120 may be configured to cause the at least one processor 110 to indicate the redundant metals as unmarked with a second indicator that is different than the first indicator. As such, in various implementations, the first indicator and the second indicator may be displayed differently with contrasting visual representations.

In some instances, the display device 150 may be coupled to the processor 110, and the instructions may cause the processor 110 to display a visual representation of the integrated circuit to a user along with the nodal features that define the connective structure of the integrated circuit, and the conductive paths in the physical layout of the integrated circuit. Also, the instructions may cause the processor 110 to display the first indicator to the user via the display device 150 of the integrated circuit to thereby indicate the valid metals as marked with the first indicator. Also, the instructions may cause the processor 110 to display the second indicator to the user via the display device 150 of the integrated circuit to thereby indicate the redundant metals as marked with the second indicator. The first indicator may refer to a first highlighted marking or outline of the valid metals associated with the valid conductive paths in the physical layout of the integrated circuit. The second indicator may refer to a second highlighted marking or outline of the redundant metals associated with the unused conductive paths in the physical layout of the integrated circuit, and also, the second highlighted marking or outline may be visually different than the first highlighted marking or outline.

In accordance with various implementations described herein in reference to FIGS. 2-4B, any one or more or all of these operations performed by the layout optimizer 120 may be altered, modified, and/or changed so as to thereby provide various specific embodiments as shown in FIGS. 2-4B. Also, each of the operations may be in the form of a logic block or module having circuit layout definitions, and the logic block or module may refer to a physical layout structure associated with integrated circuitry that is included in a place and route environment for EDA.

In some implementations, as shown in FIG. 1, the computing device 104 may also include a simulator 122 that is configured to cause the at least one processor 110 to generate one or more simulations of various integrated circuitry. The simulator 122 may be referred to as a simulating component or module and may be implemented in hardware or software. If implemented in software, the simulator 122 may be recorded or stored in memory 112 or the database 140. If implemented in hardware, the simulator 120 may be a separate processing component configured to interface with the processor 110. In some instances, the simulator 122 may refer to a SPICE simulator that is configured to generate SPICE simulations of integrated circuitry. SPICE is an acronym for Simulation Program with Integrated Circuit Emphasis, which refers to an open source analog electronic circuit simulator. Also, SPICE may refer to general-purpose software used by the semiconductor industry to check the integrity of integrated circuit designs and to predict the behavior of integrated circuit designs. Therefore, in some instances, the layout optimizer 120 may be configured to interface with the simulator 122 so as to generate timing data based on one or more simulations (including, e.g., SPICE simulations) of an integrated circuit that may be used for analyzing performance characteristics of the integrated circuit including timing data of the integrated circuit. Moreover, the layout optimizer 120 may be configured to use various generated simulations (including, e.g., SPICE simulations) of the integrated circuitry for evaluating operational behavior and conditions thereof.

In some implementations, the computing device 104 may include one or more databases 140 configured to store and/or record various data and information related to implementing circuit layout schemes and techniques in physical layout design. Also, in some instances, one or more database(s) 140 may be configured to store and/or record various information related to integrated circuitry, operating conditions, operating behavior and/or timing related data. Also, the database(s) 140 may be configured to store and/or record data and information related to integrated circuitry along with various timing data with respect to simulation data (including, e.g., SPICE simulation data).

Figure 2A:
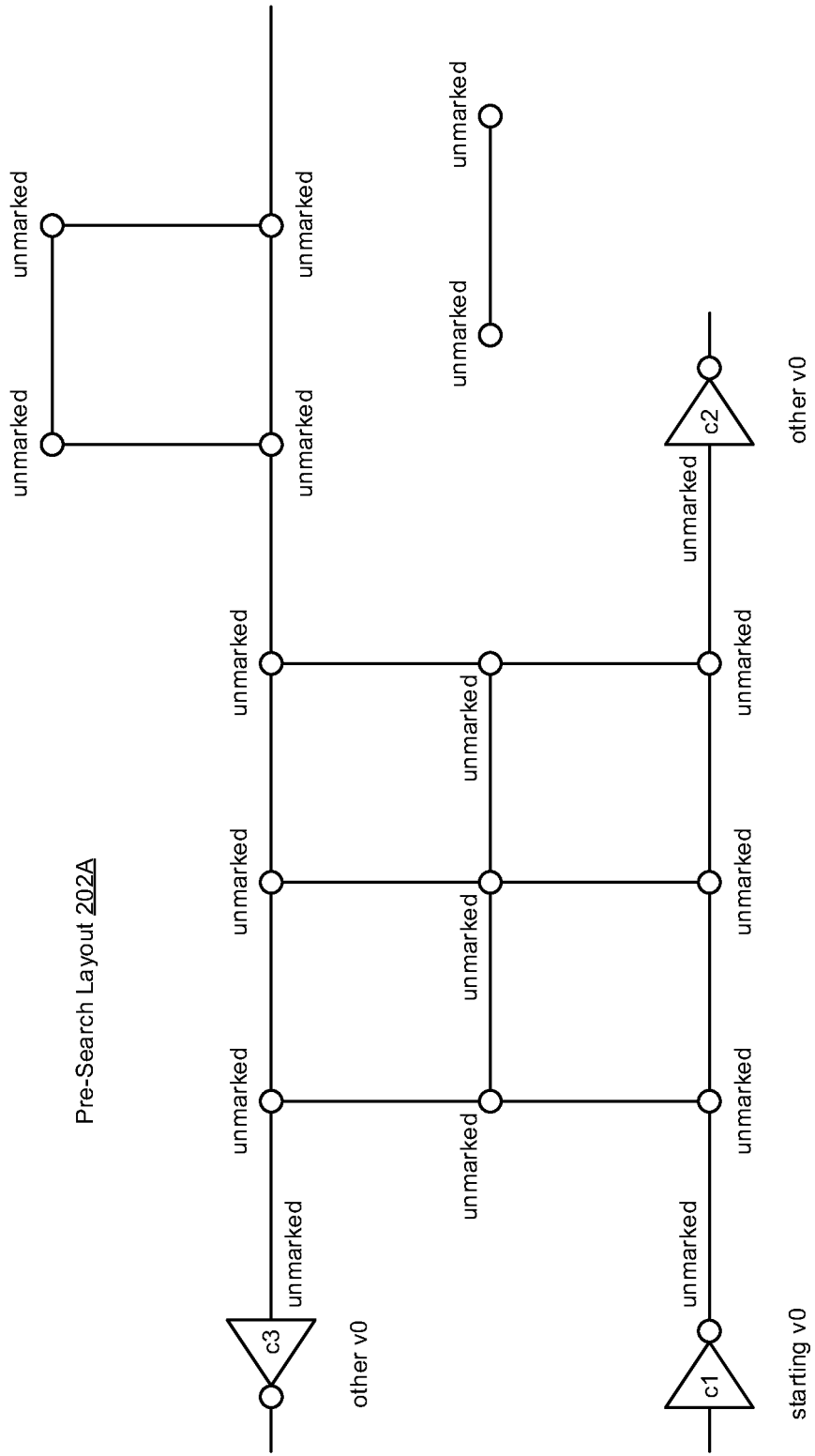

FIGS. 2A-2G illustrate various design diagrams of circuit layout architecture 202 in accordance with implementations described herein. In particular, FIG. 2A shows a layout design diagram 200A of a pre-search layout 202A of the circuit layout architecture 202, and also, FIGS. 2B-2G show a series of depth first searches 200B-200G for the layout design associated with the circuit layout architecture 202.

As shown in FIG. 2A, pre-search layout 202A of the circuit layout architecture 202 may be used to identify conductive paths in a physical layout of an integrated circuit having nodal features that define a connective structure of the integrated circuit. In some instances, the conductive paths may refer to wires and/or vias, wherein the wires include conductive metal segments that connect the nodal features. In some instances, the nodal features include circuit components and/or nodes, and the nodes conjoin the conductive paths (or metal segments) that are disposed between the circuit components. As shown in FIG. 2A, the nodal features may refer to unmarked node locations and/or unmarked circuit components or logic, such as, e.g., inverters c1, c2, c3. The circuit components may include a first inverter (c1) that serves as a starting point (i.e., starting v0), a second inverter (c2) that serves as another point (other v0), and a third inverter (c3) that serves as another point (other v0). Also, the unmarked node locations may be marked with a first indicator, such as, e.g., an open white circle, and also, the conductive paths between the unmarked node locations may be indicated with solid black lines.

Figure 2B:
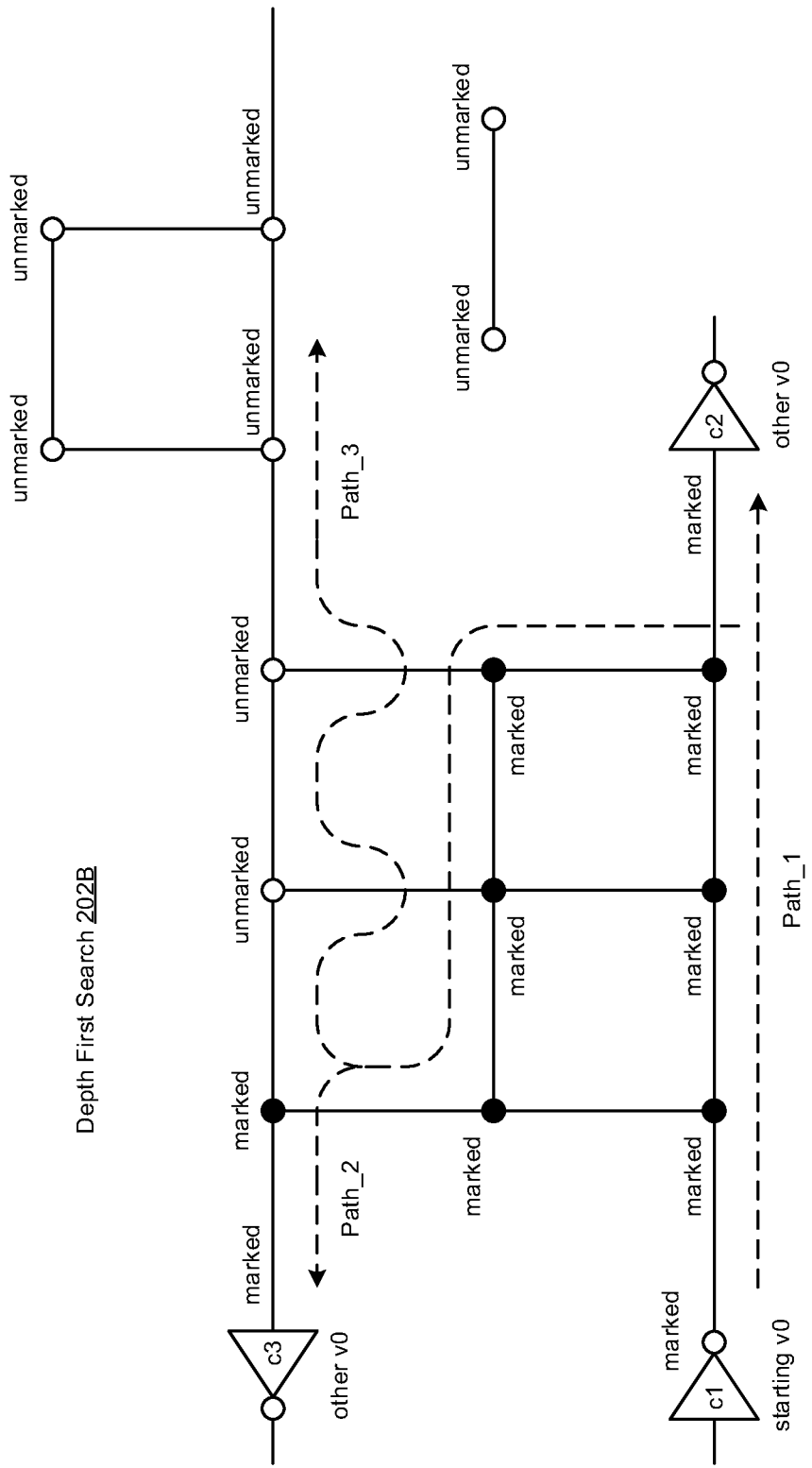

As shown in FIG. 2B, depth first search 202B of the circuit layout architecture 202 may be used to traverse the conductive paths to detect valid metals and redundant metals, wherein the valid metals may refer to valid conductive paths between the nodal features that conjoin the nodal features, and wherein the redundant metals may refer to unused conductive paths that provide disjointed paths from the nodal features. In some instances, the marked node locations may be marked with a second indicator, such as, e.g., a closed black circle with the conductive paths indicated with solid black lines.

For instance, in a first path (Path_1) between marked inverter (c1) and marked inverter (c2), the conductive Path_1 may pass through multiple conductive segments and multiple marked nodal features, and Path_1 may visually represent a first series of marked nodal features (or marked nodes). In a second path (Path_2) between marked inverter (c2) and marked inverter (c3), the conductive Path_2 may pass through other conductive segments and other marked nodal features, and also, Path_2 may visually represent the marked nodal features (or marked nodes). In other instances, in reference to a third path (Path_3) from inverters (c2 or c3), the conductive Path_3 may refer to a disjointed path (or uncoupled path) passing through one or more unmarked nodal features (or unmarked nodes) to open-ended conductive segments.

Therefore, valid metals may refer to the marked locations, and the valid metals may be indicated (or marked) with an indicator, such as, e.g., the closed black circle with the conductive paths indicated with solid black lines. Also, redundant metals may refer to the unmarked locations, and the redundant metals may be indicated (or marked) with a different indicator, such as, e.g., the open white circle with the conductive paths indicated with solid black lines. In various instances, the indicators are different, and also, the first indicator may be switched with the second indicator, and vice versa.

Figure 2C:
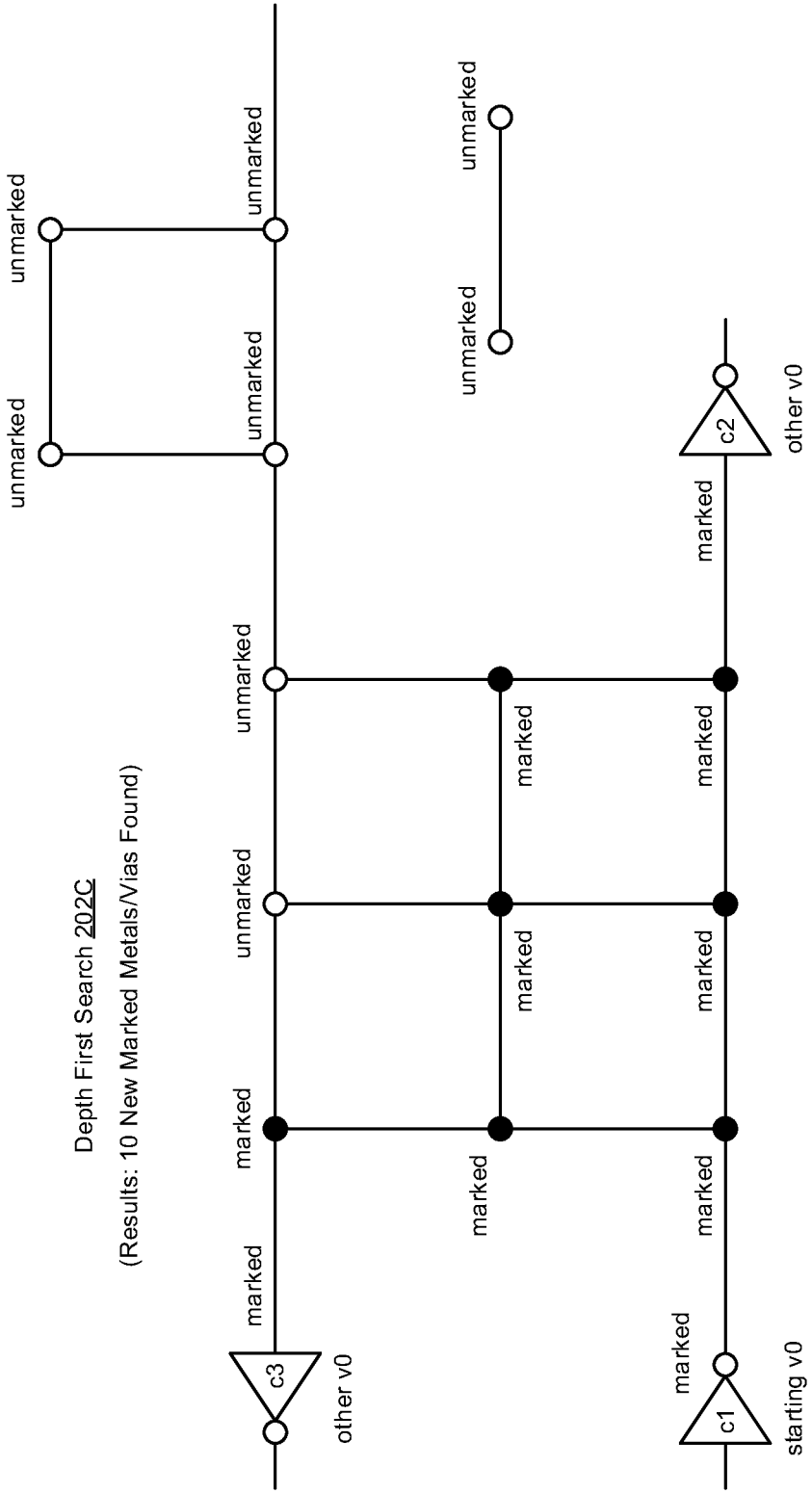

As shown in FIG. 2C, depth first search 202C of the circuit layout architecture 202 may be used to indicate results of newly marked metals and/or vias, wherein valid metals and redundant metals are detected and indicated with the indicators. In this instance of the results in FIG. 2C, the valid metals may refer to valid conductive paths (i.e., marked paths) between the nodal features that conjoin the nodal features, and also, the redundant metals may refer to unused conductive paths (i.e., unmarked paths) that provide disjointed paths from the nodal features. For instance, the results of FIG. 2C indicate ten (10) new marked metals/vias found in the circuit layout architecture 202.

Figure 2D:
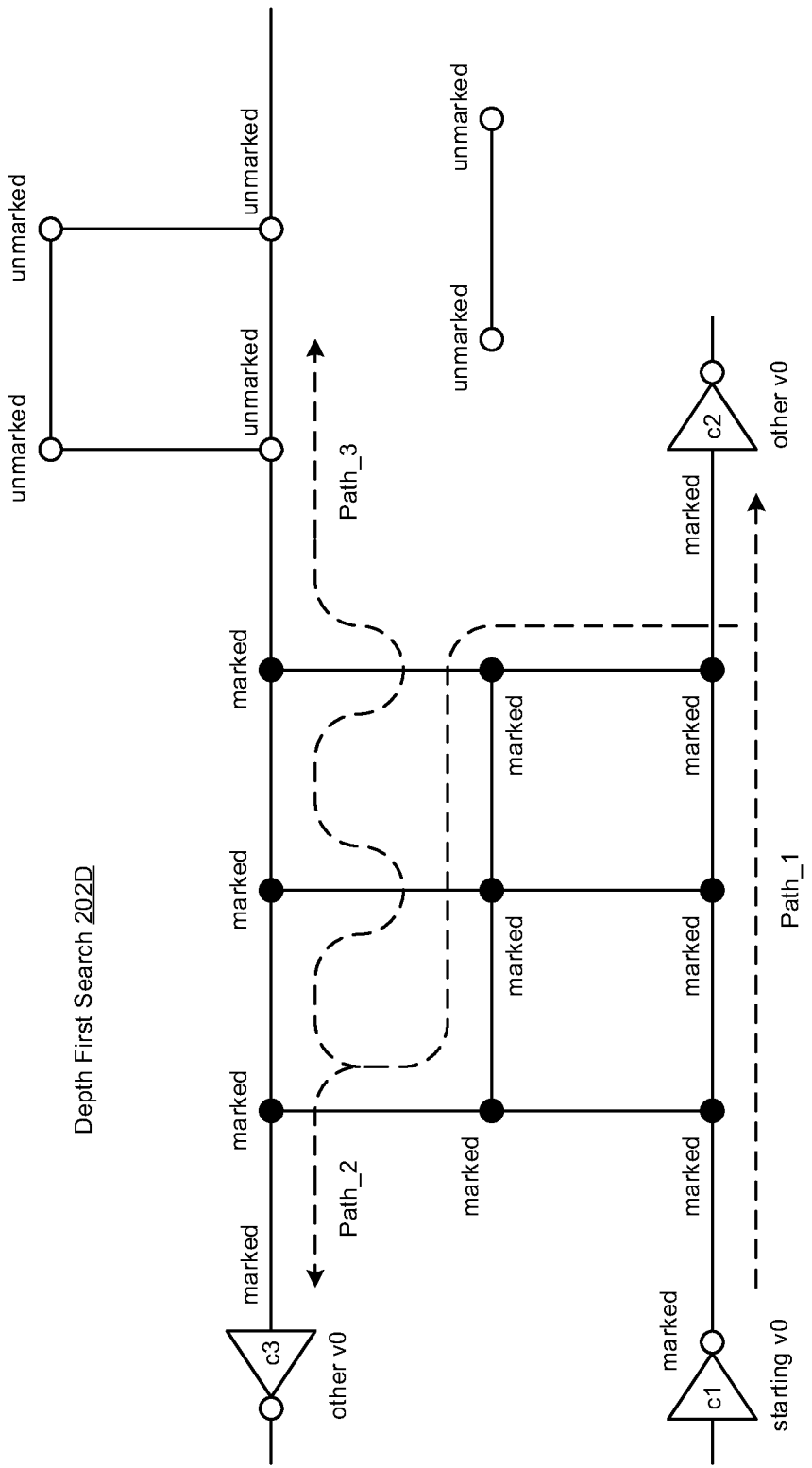

As shown in FIG. 2D, depth first search 202D of the circuit layout architecture 202 may be used to repeat the traverse of the conductive paths to detect other valid metals and/or redundant metals. For instance, in a first path (Path_1) between marked inverter (c1) and marked inverter (c2), the conductive Path_1 passes through multiple conductive segments and multiple marked nodal features, and Path_1 may visually represent a first series of marked nodal features (or marked nodes). In a second path (Path_2) between marked inverter (c2) and marked inverter (c3), the conductive Path_2 may pass through other conductive segments and other marked nodal features, and Path_2 may visually represent the marked nodal features (or marked nodes). In other instances, in reference to a third path (Path_3) from inverters (c2 or c3), the conductive Path_3 may refer to a disjointed path (or uncoupled path) passing through one or more unmarked nodal features (or unmarked nodes) to open-ended conductive segments.

Figure 2E:
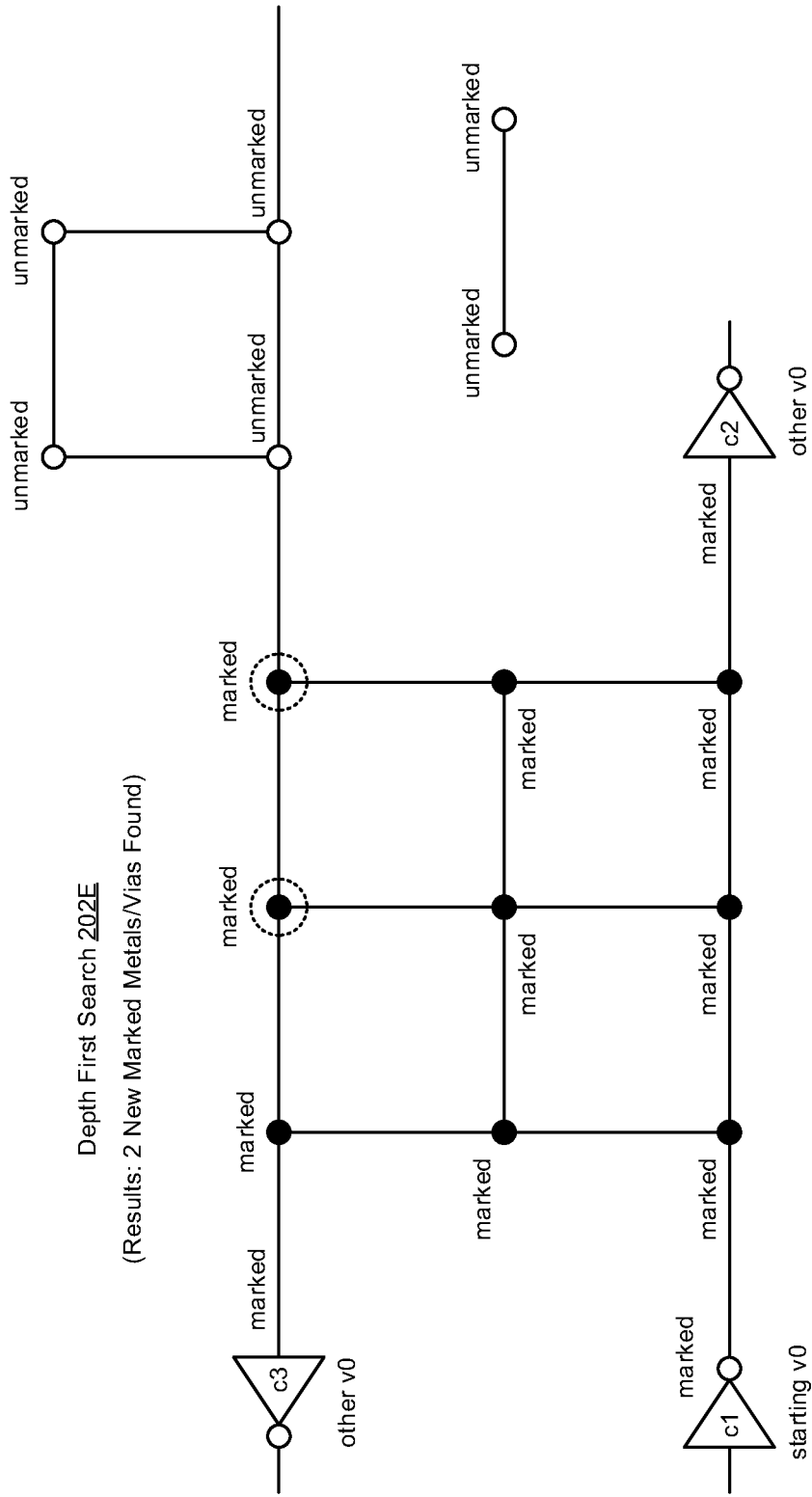

As shown in FIG. 2E, depth first search 202E of the circuit layout architecture 202 may be used to indicate results of newly marked metals and/or vias, wherein valid metals and/or redundant metals are detected and indicated with the indicators. In this instance of results in FIG. 2E, the valid metals may refer to valid conductive paths (i.e., marked paths) between the nodal features that conjoin the nodal features, and also, the redundant metals may refer to unused conductive paths (i.e., unmarked paths) that provide disjointed paths from the nodal features. For instance, the results of FIG. 2E indicate two (2) new marked metals/vias found in the circuit layout architecture 202, e.g., wherein the two new marked metals/vias may be highlighted with dashed circles.

As shown in FIG. 2F, depth first search 202F of the circuit layout architecture 202 may be used to again repeat the traverse of conductive paths to detect other valid metals and/or redundant metals. For instance, in a first path (Path_1) between marked inverter (c1) and marked inverter (c2), the conductive Path_1 passes through multiple conductive segments and multiple marked nodal features, and Path_1 may visually represent a first series of marked nodal features (or marked nodes). In a second path (Path_2) between marked inverter (c2) and marked inverter (c3), the conductive Path_2 may pass through other conductive segments and other marked nodal features, and Path_2 may visually represent the marked nodal features (or marked nodes). In other instances, in reference to a third path (Path_3) from inverters (c2 or c3), the conductive Path_3 may refer to a disjointed path (or uncoupled path) passing through one or more unmarked nodal features (or unmarked nodes) to open-ended conductive segments.

Figure 2G:
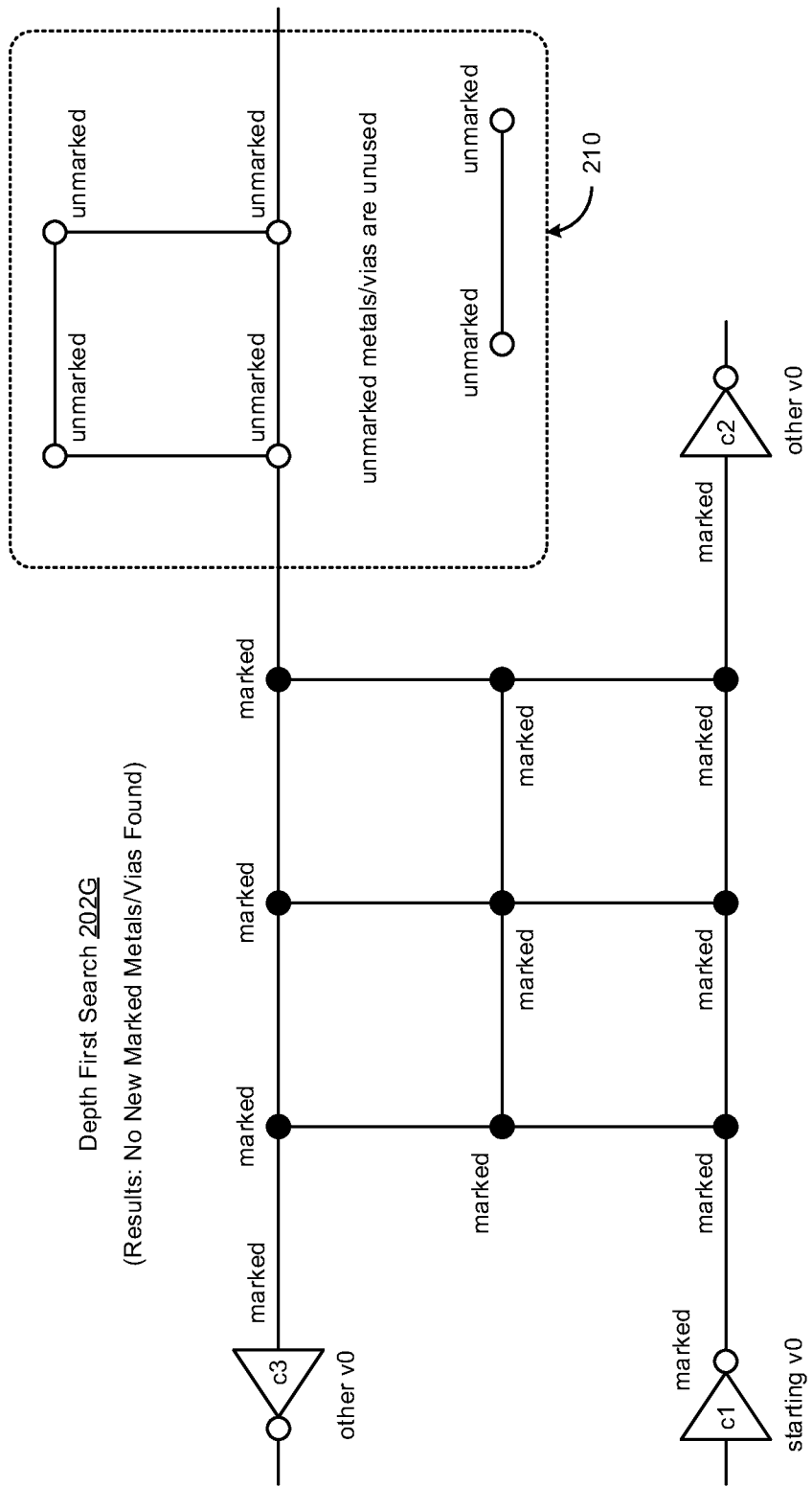

As shown in FIG. 2G, depth first search 202G of the circuit layout architecture 202 may be used to indicate results of newly marked metals and/or vias, wherein valid metals and/or redundant metals are detected and indicated with the indicators. In this instance of results in FIG. 2G, the valid metals may refer to valid conductive paths (i.e., marked paths) between the nodal features that conjoin the nodal features, and also, the redundant metals may refer to unused conductive paths (i.e., unmarked paths) that provide disjointed paths from the nodal features. For instance, the results of FIG. 2G indicate that no new marked metals/vias were found in the circuit layout architecture 202. Further, in this result, the unmarked metals and/or vias may be surrounded by with a dashed box 210.

Figure 3A:
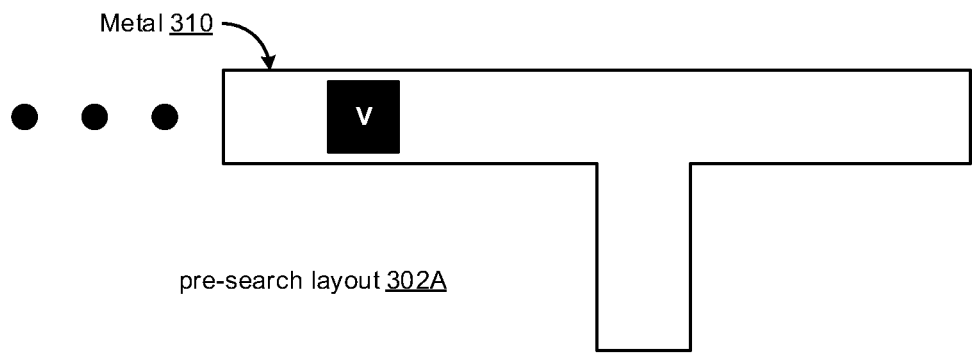
FIGS. 3A-3F illustrate various design diagrams of metal layout architecture in accordance with implementations described herein.

FIGS. 3A-3F illustrate various design diagrams of metal layout architecture 302 in accordance with implementations described herein. In particular, FIG. 3A shows a design diagram 300A of a pre-search layout 302A of the circuit layout architecture 302, and also, FIGS. 3B-3F show a series of depth searches 300B-300F associated with the circuit layout architecture 302.

As shown in FIG. 3A, pre-search layout 302A of the circuit layout architecture 302 may be used to identify conductive paths in a physical layout of an integrated circuit having nodal features that define a connective structure of the integrated circuit. In some instances, the conductive paths may refer to wires and/or vias, and the wires may refer to one or more conductive metal segments (e.g., metal wire segment 310) that connect the nodal features, and the vias (V) may refer to (long) metal-via extensions that may protrude from the nodal features. In some instances, the conductive paths may refer to wires, and the nodal features may refer to vias conjoined to the wires, and the wires may have one or more disconnected ends that refer to a convex u-shaped metal. In some instances, multiple wires may intersect (or join together) at a turning point, which may be referred to as a branch connection. Also, in some instances, locations of the disconnected ends may be marked (or highlighted) with a first indicator, such as, e.g., a dashed oval circle, and also, locations of the turning points may be marked (or highlighted) with a second indicator that is different than the first indicator, such as, e.g., a dashed straight line, which will be described in greater detail herein in reference to FIGS. 3B-3F.

Figure 3B:
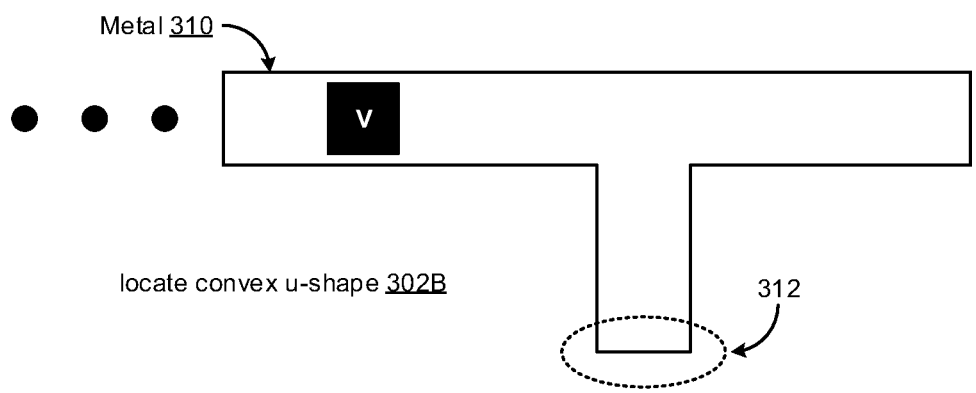

As shown in FIG. 3B, a depth search 302B of the circuit layout architecture 302 may be used to traverse the conductive paths to detect metal-via extensions that may protrude from the nodal features along a disjointed route from the nodal features. In some instances, the depth search 302B may locate a disconnected end 312 along the disjointed route of metal 310 from at least one nodal feature, such as, e.g., via (V). Also, as shown in FIG. 3B, the disconnected end may refer to a convex u-shaped end of the metal 310 at one of the disjointed routes protruding from the via (V).

Figure 3C:
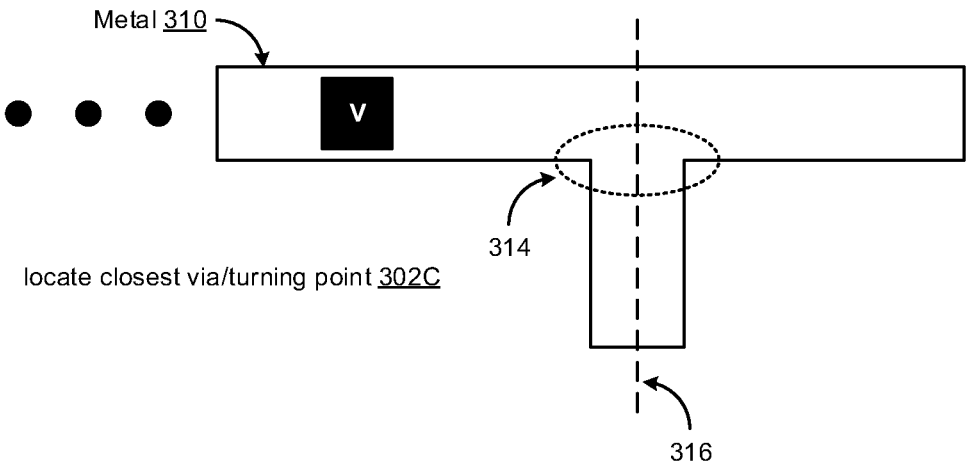

As shown in FIG. 3C, a depth search 302C of the circuit layout architecture 302 may be used to traverse the conductive paths to locate a turning point 314 along the disjointed route and closest to the via (V) between the at least one nodal feature (V) and the disconnected end 314 of the metal 310. In some instances, the turning point 314 may refer to an intersection point between the u-shaped metal 312 and other metals. Also, in some instances, the depth search 302C may mark (or highlight) the turning point 314 with the first indicator (e.g., the dashed oval circle), and the depth search 302C may also mark (or highlight) the metal-via extension 316 at the turning point 314 with the second indicator (e.g., the dashed straight line).

Figure 3D:
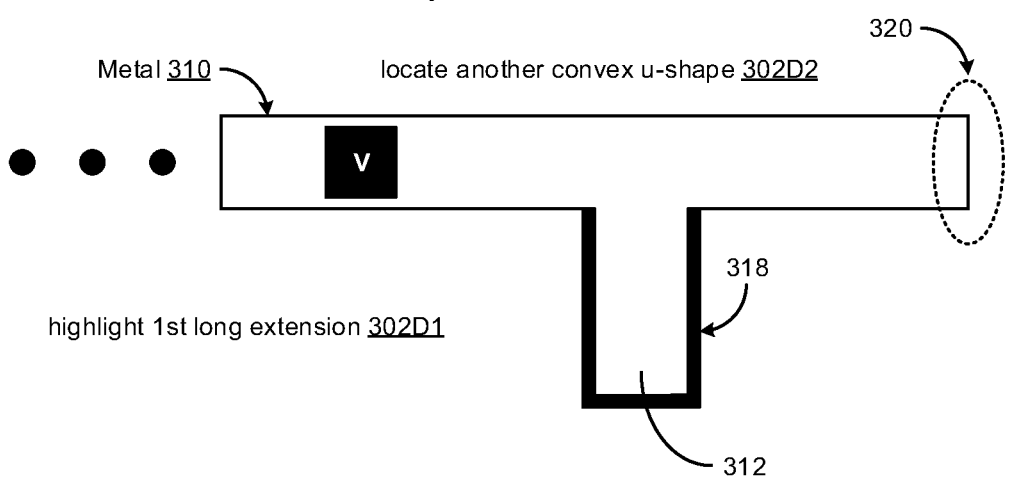

As shown in FIG. 3D, other depth searches 302D1, 302D2 of the circuit layout architecture 302 may be used to traverse the conductive paths to identify the conductive path associated with the disjointed route as a metal-via extension (e.g., 302D1) and also to locate another disconnected end 320 (e.g., 302D2) of the metal 310. The depth search 302D1 may be used to mark (or highlight) the disconnected end 312 as a first long metal-via extension with a third indicator 318, such as, e.g., a thick black line. In some instances, the depth search 302D2 may be used to mark (or highlight) the other disconnected end 320 as another convex u-shaped end of the metal 310 at another end of the disjointed routes protruding from the via (V).

Figure 3E:
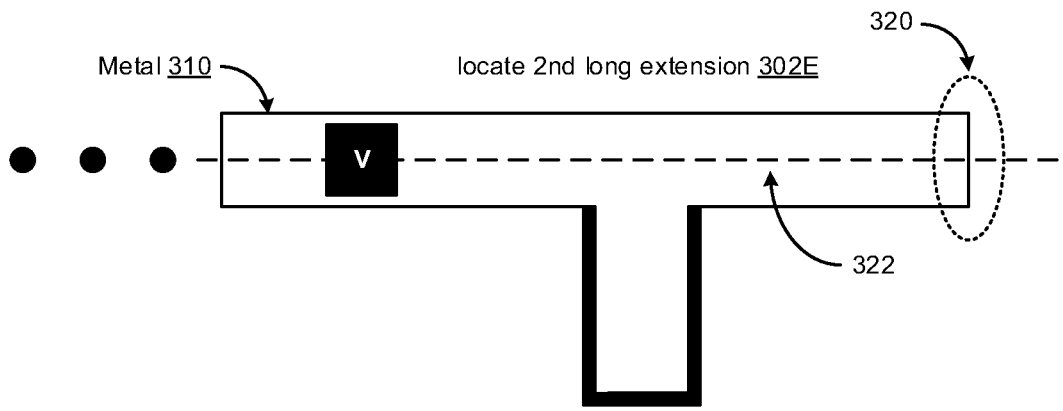

As shown in FIG. 3E, a depth search 302E of the circuit layout architecture 302 may be used to traverse the conductive paths to locate another metal-via extension 322 along the disjointed route between the at least one nodal feature (V) and the other disconnected end 320 of the metal 310. In some instances, the depth search 302E may mark (or highlight) the second metal-via extension 322 with the second indicator (e.g., the dashed straight line). Also, in this instance, the second metal-via extension 322 may be referred to a long metal-via extension that protrudes from the via (V).

Figure 3F:
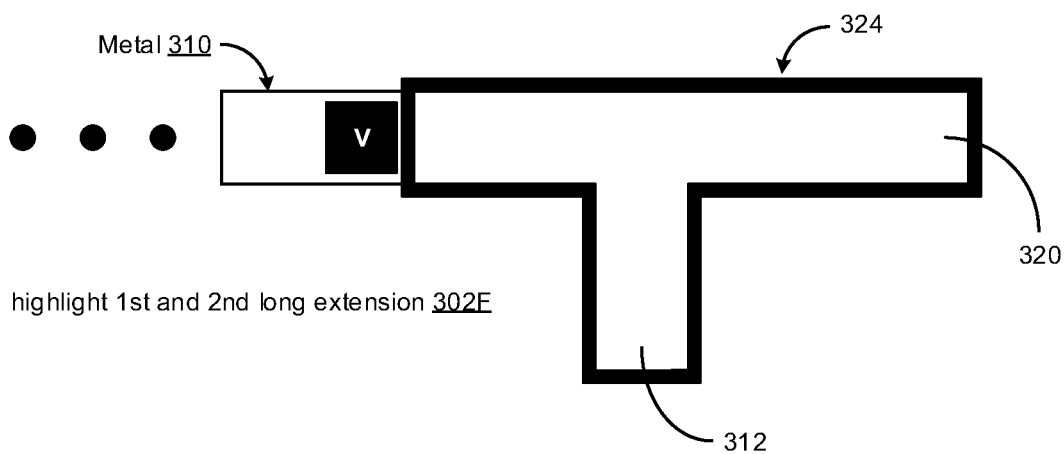

As shown in FIG. 3F, a depth search 302F of the circuit layout architecture 302 may be used to mark (or highlight) the first long metal-via extension 316 and mark (or highlight) the second long metal-via extension 322 with a fourth indicator 324, such as, e.g., a thick black line. Also, in some instances, the depth search 302F may be used to mark (or highlight) the first and second long metal-via extensions 316, 322 with the thick black line that surrounds the metal 310 near the via (V) and around the convex u-shaped ends 312, 320 of the metal 310.

Figure 4A:
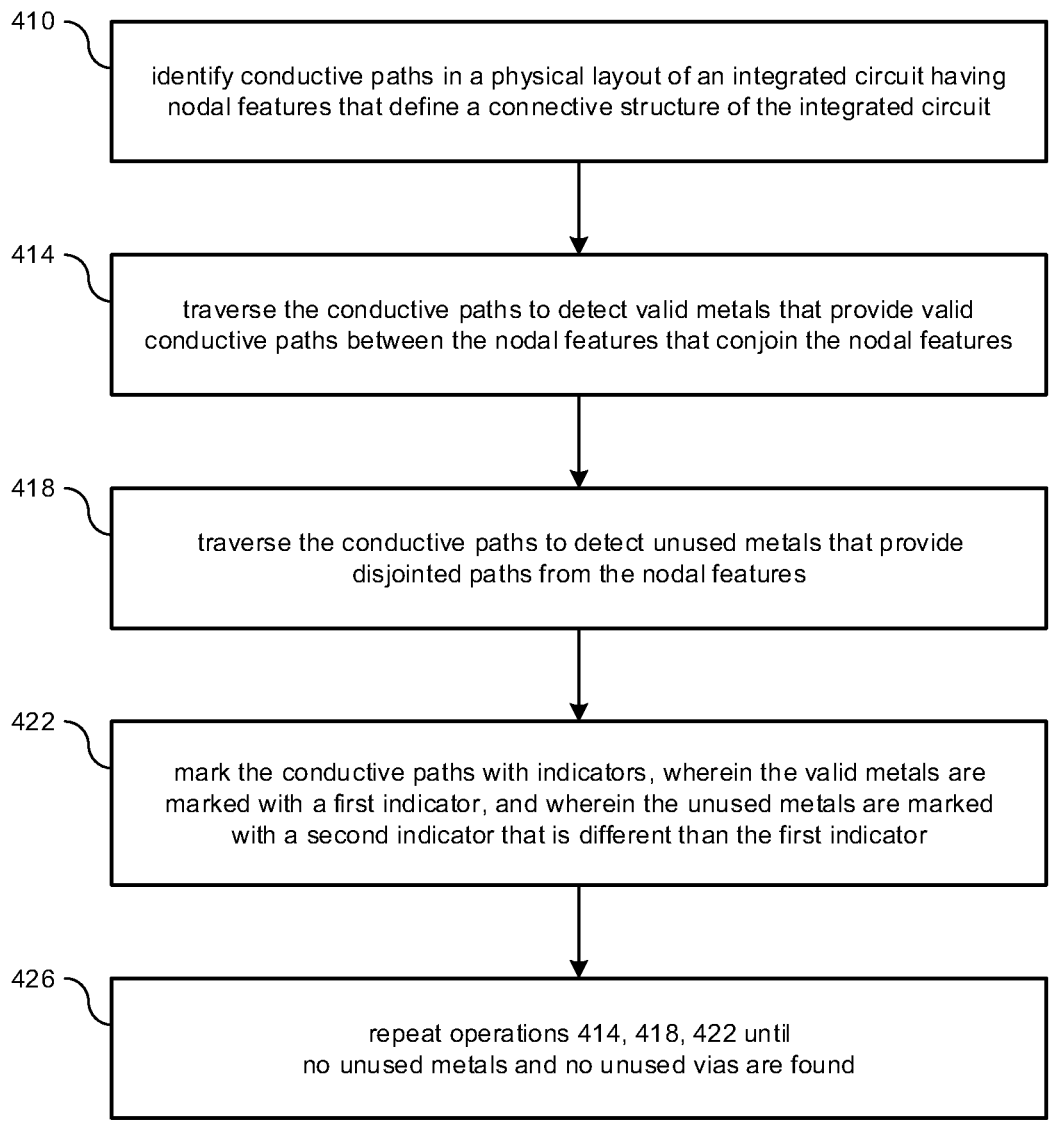
FIGS. 4A-4B illustrate various process flow diagrams of methods for providing circuit layout techniques in accordance with implementations described herein.

FIG. 4A illustrates a process diagram of a method 400A for providing circuit layout techniques in accordance with implementations described herein.

It should be understood that even though method 400A indicates a particular order of operation execution, in some cases, various portions of the operations may be executed in a different order, and on different systems. In other cases, other operations and/or steps may be added to and/or omitted from method 400A. Also, method 400A may be implemented in hardware and/or software. If implemented in hardware, method 400A may be implemented with components and/or circuitry, as described herein in reference to FIGS. 1-3F. Also, if implemented in software, method 400A may be implemented as a program and/or software instruction process that is configured for providing circuit layout schemes and techniques described herein. Also, if implemented in software, instructions related to implementing method 400A may be stored and/or recorded in memory and/or a database. For instance, various types of computing systems or devices having at least one processor and memory may be configured to perform method 400A.

In various implementations, method 400A may refer to a method of designing, providing, building, fabricating and/or manufacturing various circuit layout architecture as an integrated system, device and/or circuitry that may involve use of the various circuit components described herein so as to implement circuit layout schemes and techniques associated therewith. In some instances, the circuit layout architecture may be integrated with computing circuitry and various related components on a single chip, and also, the circuit layout architecture may be implemented in various embedded chip-level systems for various electronic, mobile and Internet-of-things (IoT) applications.

At block 410, method 400A may identify conductive paths in a physical layout of an integrated circuit having nodal features that are used to define a connective structure of the integrated circuit. In some instances, the conductive paths may include wires and vias, and the nodal features may include circuit components and nodes, and the nodes may conjoin the conductive paths disposed between the circuit components.

At block 414, method 400A may traverse the conductive paths to detect valid metals that may provide valid conductive paths between the nodal features that may be used to conjoin the nodal features.

At block 418, method 400A may traverse the conductive paths to detect unused metals that may provide disjointed conductive paths from the nodal features. In some instances, the disjointed paths may refer to conductive paths that extend from at least one nodal feature of the nodal features, and the disjointed paths are uncoupled to at least one other nodal feature of the nodal features.

At block 422, method 400A may mark the conductive paths with indicators, and the valid metals may be marked with a first indicator, and also, the unused metals may be marked with a second indicator that is different than the first indicator. In some instances, the first indicator may be used to mark the valid metals in relation to the valid conductive paths in the physical layout of the integrated circuit. Also, in some instances, the second indicator may be used to mark the unused metals in relation to the disjointed conductive paths in the physical layout of the integrated circuit, and the second indicator is visually different than the first indicator.

Also, at block 426, method 400A may repeat one or more of the operations in blocks 414, 418, 422 until no unused metals (i.e., no redundant metals) are found and/or until no unused vias (i.e., no redundant vias) are found.

In some instances, method 400A may include displaying a visual representation of the integrated circuit to a user along with the nodal features that define the connective structure of the integrated circuit, and the conductive paths in the physical layout of the integrated circuit. The visual representation may also include displaying the first indicator that marks the valid metals, and displaying the second indicator that marks the unused metals, wherein the second indicator is visually different than the first indicator.

Figure 4B:
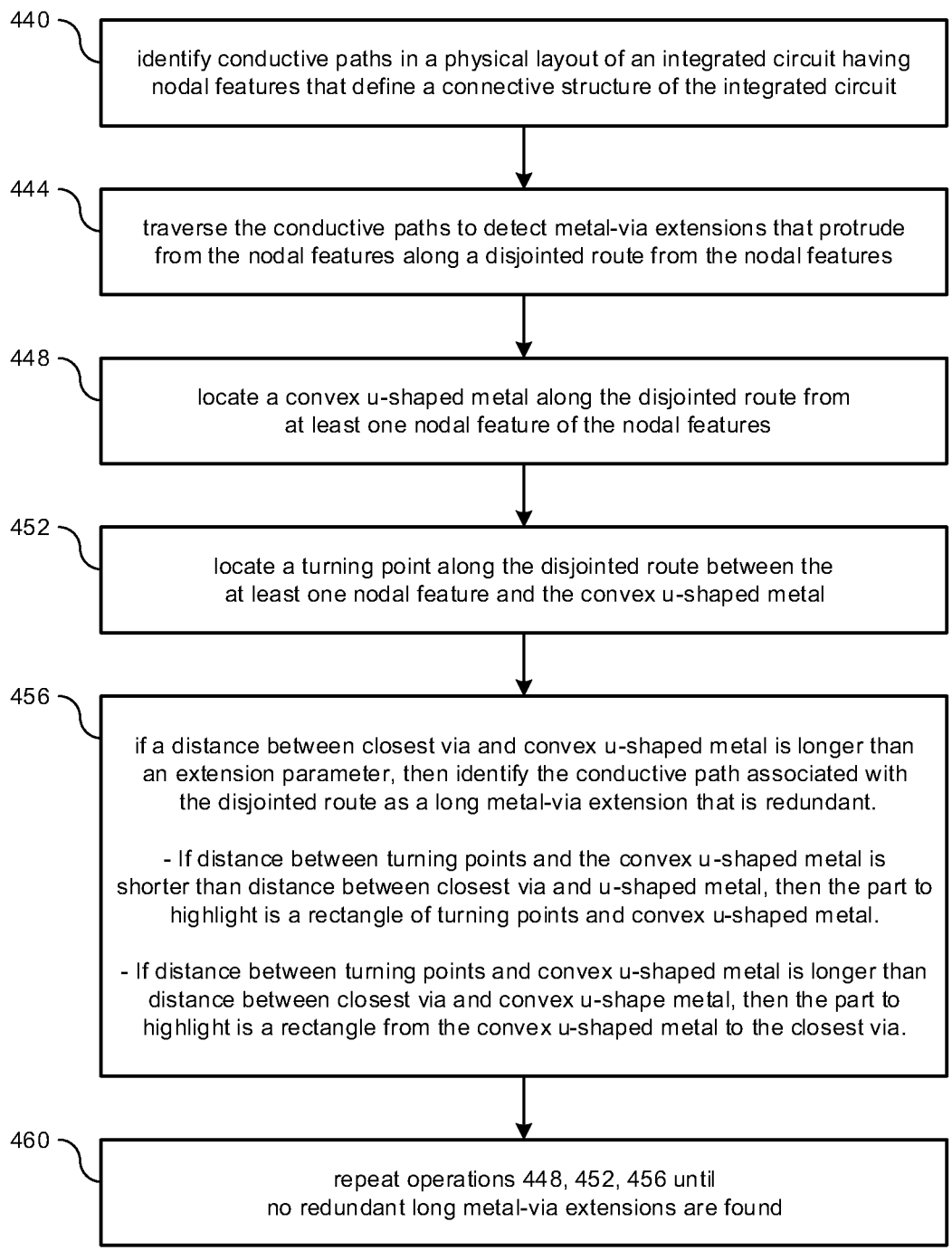

FIG. 4B illustrates a process diagram of a method 400B for providing circuit layout techniques in accordance with implementations described herein.

It should be understood that even though method 400B indicates a particular order of operation execution, in some cases, various portions of the operations may be executed in a different order, and on different systems. In other cases, other operations and/or steps may be added to and/or omitted from method 400B. Also, method 400B may be implemented in hardware and/or software. If implemented in hardware, method 400B may be implemented with components and/or circuitry, as described herein in reference to FIGS. 1-4A. Also, if implemented in software, method 400B may be implemented as a program and/or software instruction process that is configured for providing circuit layout schemes and techniques described herein. Also, if implemented in software, instructions related to implementing method 400B may be stored and/or recorded in memory and/or a database. For instance, various types of computing systems or devices having at least one processor and memory may be configured to perform method 400B.

In various implementations, method 400B may refer to a method of designing, providing, building, fabricating and/or manufacturing various circuit layout architecture as an integrated system, device and/or circuitry that may involve use of the various circuit components described herein so as to implement circuit layout schemes and techniques associated therewith. In some instances, the circuit layout architecture may be integrated with computing circuitry and various related components on a single chip, and also, the circuit layout architecture may be implemented in various embedded chip-level systems for various electronic, mobile and Internet-of-things (IoT) applications.

At block 440, method 400B may identify conductive paths in a physical layout of an integrated circuit having nodal features that may define a connective structure of the integrated circuit. In some instances, the conductive paths may include wires, and the nodal features may include vias conjoined to the wires, and also, the disconnected end may refer to a convex u-shaped metal. In some instances, the block 440 may refer to the pre-search layout 302A shown in FIG. 3A, wherein the metal 310 may be identified as a conductive path, and the via (V) may be identified as a nodal feature.

At block 444, method 400B may traverse the conductive paths to detect metal-via extensions that protrude from the nodal features along a disjointed route (or disjointed path) from the nodal features. In some instances, the block 444 may refer to traversing the conductive path of the metal 310 shown in FIG. 3A, wherein the metal 310 may be traversed as a conductive path, and the disconnected end 312 is identified as a convex u-shaped metal end that may be detected along the conductive path between the via (V) and the convex u-shaped metal end 312. Also, the disjointed route (or disjointed path) may refer to the conductive path of the metal 310 (or the metal-via extension) disposed between the via (V) and the convex u-shaped metal end 312.

At block 448, method 400B may locate a disconnected end along the disjointed route from at least one nodal feature (e.g., via) of the nodal features. In some instances, the block 448 may refer to locating the convex u-shape 302B shown in FIG. 3A, wherein the disconnected end refers to the convex u-shaped metal end 312.

At block 452, method 400B may locate a turning point along the disjointed route between the at least one nodal feature and the disconnected end. In some instances, the turning point may refer to an intersection point between a nodal feature (e.g., via) and the disconnected end (i.e., convex u-shaped metal end) of the disjointed route. I.e., turning points refer to the intersection points between u-shape metals and other metals. Also, in some instances, the conductive paths may be traversed to locate the turning point (or branch intersection) along the disjointed route and closest to the via (V) between the nodal feature (V) and the disconnected end (or convex u-shaped end) of the metal wire. Thus, in some instances, the "closest via" may refer to the via (V) that is closest to the convex u-shape metal end along the direction of the disjointed path (or discontinued branch) of the metal wire where the convex u-shape end is located.

At block 456, method 400B may identify the conductive path associated with the disjointed route as a metal-via extension (or a long metal-via extension). For instance, at block 456, if a distance between the closest via and the convex-shaped metal is longer than an extension parameter, then method 400B may identify the conductive path associated with the disjointed route as a long metal-via extension that is redundant. Also, in some instances, if the distance between the closest via and the convex u-shaped metal end is longer than the extension parameter, then a long metal-via extension is found (e.g., if there is no via along the metal wire, then the distance may be considered infinite).

Also, if the distance between the turning point and the convex u-shaped metal end is shorter than the distance between the closest via and the convex u-shaped metal end, then the part to highlight may refer to a rectangular portion that may encompass the turning point and the convex u-shaped metal end. Otherwise, if the distance between the turning point and the convex u-shaped metal end is longer than the distance between the closest via and the convex u-shaped metal end, then the part to highlight may refer to the rectangular portion from the convex u-shaped metal end to the closest via.

Also, at block 460, method 400B may repeat one or more of the operations in blocks 448, 452, 456 until no redundant long metal-via extensions are found.

In some implementations, method 400B may mark the convex u-shaped metal with a first highlighted indicator, and method 400B may also mark the turning point with a second highlighted indicator that is different than the first highlighted indicator. In addition, method 400B may display a visual representation of the integrated circuit to a user along with the nodal features that define the connective structure of the integrated circuit, and the conductive paths in the physical layout of the integrated circuit. Further, method 400B may display the first highlighted indicator that marks the convex u-shaped metal, and also display the second highlighted indicator that marks the turning point, wherein the second highlighted indicator is visually different than the first highlighted indicator.

It should be intended that the subject matter of the claims not be limited to the implementations and illustrations provided herein, but include modified forms of those implementations including portions of implementations and combinations of elements of different implementations in accordance with the claims. It should be appreciated that in the development of any such implementation, as in any engineering or design project, numerous implementation-specific decisions should be made to achieve developers' specific goals, such as compliance with system-related and business related constraints, which may vary from one implementation to another. Moreover, it should be appreciated that such a development effort may be complex and time consuming, but would nevertheless be a routine undertaking of design, fabrication, and manufacture for those of ordinary skill having benefit of this disclosure.

Described herein are implementations of an apparatus having a processor and memory with instructions stored thereon that, when executed by the processor, cause the processor to identify conductive paths in a physical layout of an integrated circuit having nodal features that define a connective structure of the integrated circuit. The instructions may cause the processor to traverse the conductive paths to detect valid metals and redundant metals. The valid metals may refer to valid conductive paths between the nodal features that conjoin the nodal features. The redundant metals may refer to unused conductive paths that provide disjointed paths from the nodal features. The instructions may cause the processor to indicate the valid metals as marked with a first indicator and to indicate the redundant metals as unmarked with a second indicator that is different than the first indicator.

Described herein are various implementations of a method. The method may include identifying conductive paths in a physical layout of an integrated circuit having nodal features that define a connective structure of the integrated circuit. The method may include traversing the conductive paths to detect valid metals that provide valid conductive paths between the nodal features that conjoin the nodal features. The method may include traversing the conductive paths to detect unused metals that provide disjointed conductive paths from the nodal features. The method may include marking the conductive paths with indicators, wherein the valid metals may be marked with a first indicator, and wherein the unused metals may be marked with a second indicator that is different than the first indicator.

Described herein are various implementations of a method. The method may include identifying conductive paths in a physical layout of an integrated circuit having nodal features that define a connective structure of the integrated circuit. The method may include traversing the conductive paths to detect metal-via extensions that protrude from the nodal features along a disjointed route from the nodal features. The method may include locating a disconnected end along the disjointed route from at least one nodal feature of the nodal features. The method may include locating a turning point along the disjointed route between the at least one nodal feature and the disconnected end. The method may include identifying the conductive path associated with the disjointed route as a metal-via extension.

Reference has been made in detail to various implementations, examples of which are illustrated in the accompanying drawings and figures. In the following detailed description, numerous specific details are set forth to provide a thorough understanding of the disclosure provided herein. However, the disclosure provided herein may be practiced without these specific details. In some other instances, well-known methods, procedures, components, circuits and networks have not been described in detail so as not to unnecessarily obscure details of the embodiments.

It should also be understood that, although the terms first, second, etc. may be used herein to describe various elements, these elements should not be limited by these terms. These terms are only used to distinguish one element from another. For example, a first element could be termed a second element, and, similarly, a second element could be termed a first element. The first element and the second element are both elements, respectively, but they are not to be considered the same element.

The terminology used in the description of the disclosure provided herein is for the purpose of describing particular implementations and is not intended to limit the disclosure provided herein. As used in the description of the disclosure provided herein and appended claims, the singular forms "a," "an," and "the" are intended to include the plural forms as well, unless the context clearly indicates otherwise. The term "and/or" as used herein refers to and encompasses any and all possible combinations of one or more of the associated listed items. The terms "includes," "including," "comprises," and/or "comprising," when used in this specification, specify a presence of stated features, integers, steps, operations, elements, and/or components, but do not preclude the presence or addition of one or more other features, integers, steps, operations, elements, components and/or groups thereof.

As used herein, the term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context. The terms "up" and "down"; "upper" and "lower"; "upwardly" and "downwardly"; "below" and "above"; and other similar terms indicating relative positions above or below a given point or element may be used in connection with some implementations of various technologies described herein.

While the foregoing is directed to implementations of various techniques described herein, other and further implementations may be devised in accordance with the disclosure herein, which may be determined by the claims that follow.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. An apparatus, comprising:
    a processor; and
    memory having instructions stored thereon that, when executed by the processor, cause the processor to:
        identify conductive paths in a physical layout of an integrated circuit having nodal features that define a connective structure of the integrated circuit;
        traverse the conductive paths to detect valid metals and redundant metals, wherein the valid metals refer to valid conductive paths between the nodal features that conjoin the nodal features, and wherein the redundant metals refer to unused conductive paths that provide disjointed paths from the nodal features;
        traverse the conductive paths to detect metal-via extensions that protrude from the nodal features along a disjointed route from the nodal features, wherein to traverse the conductive paths, the processor is configured to:
            locate a disconnected end along the disjointed route from at least one nodal feature of the nodal features, and
            identify the conductive path associated with the disjointed route as a metal-via extension;
        indicate the valid metals as marked with a first indicator; and
        indicate the redundant metals as unmarked with a second indicator that is different than the first indicator.

2. The apparatus of claim 1, wherein the conductive paths include wires and vias, and wherein the disconnected end refers to a convex u-shaped metal.

3. The apparatus of claim 2, wherein the wires include conductive metal segments that connect the nodal features, and wherein the vias include long metal-via extensions that protrude from the nodal features.

4. The apparatus of claim 1, wherein the nodal features include circuit components and nodes, and wherein the nodes conjoin the conductive paths disposed between the circuit components.

5. The apparatus of claim 1, wherein the disjointed paths refer to conductive paths that extend from at least one nodal feature of the nodal features and are uncoupled to at least one other nodal feature of the nodal features, and wherein to traverse the conductive paths, the processor is configured to:
    locate a turning point along the disjointed route between the at least one nodal feature and the disconnected end.

6. The apparatus of claim 1, further comprising:
    a display coupled to the processor,
    wherein the instructions cause the processor to display a visual representation of the integrated circuit to a user along with:
        the nodal features that define the connective structure of the integrated circuit, and
        the conductive paths in the physical layout of the integrated circuit.

7. The apparatus of claim 6, wherein the instructions cause the processor to display the first indicator to the user via the display of the integrated circuit to thereby indicate the valid metals as marked with the first indicator.

8. The apparatus of claim 7, wherein the instructions cause the processor to display the second indicator to the user via the display of the integrated circuit to thereby indicate the redundant metals as marked with the second indicator.

9. The apparatus of claim 8, wherein the first indicator is a first highlighted marking or outline of the valid metals associated with the valid conductive paths in the physical layout of the integrated circuit.

10. The apparatus of claim 9, wherein the second indicator is a second highlighted marking or outline of the redundant metals associated with the unused conductive paths in the physical layout of the integrated circuit, and wherein the second highlighted marking or outline is visually different than the first highlighted marking or outline.

11. A method comprising:
    identifying conductive paths in a physical layout of an integrated circuit having nodal features that define a connective structure of the integrated circuit;
    traversing the conductive paths to detect valid metals that provide valid conductive paths between the nodal features that conjoin the nodal features;
    traversing the conductive paths to detect unused metals that provide disjointed conductive paths from the nodal features;
    traversing the conductive paths to detect metal-via extensions that protrude from the nodal features along one of the disjointed paths from the nodal features, wherein traversing the conductive paths comprises:
        locating a turning point along the disjointed route between the at least one nodal feature and a disconnected end, and
        identifying the conductive path associated with the disjointed route as a metal-via extension; and
    marking the conductive paths with indicators, wherein the valid metals are marked with a first indicator, and wherein the unused metals are marked with a second indicator that is different than the first indicator.

12. The method of claim 11, wherein the conductive paths include wires and vias, and wherein the nodal features include circuit components and nodes, and wherein the nodes conjoin the conductive paths disposed between the circuit components.

13. The method of claim 11, wherein the disjointed paths refer to conductive paths that extend from at least one nodal feature of the nodal features and are uncoupled to at least one other nodal feature of the nodal features.

14. The method of claim 11, wherein:
    the first indicator marks the valid metals in relation to the valid conductive paths in the physical layout of the integrated circuit,
    the second indicator marks the unused metals in relation to the disjointed conductive paths in the physical layout of the integrated circuit, and
    the second indicator is visually different than the first indicator.

15. The method of claim 11, further comprising:
    displaying a visual representation of the integrated circuit to a user along with:
        the nodal features that define the connective structure of the integrated circuit, the conductive paths in the physical layout of the integrated circuit, the first indicator that marks the valid metals, and the second indicator that marks the unused metals, wherein the second indicator is visually different than the first indicator.

16. A method comprising:

identifying conductive paths in a physical layout of an integrated circuit having nodal features that define a connective structure of the integrated circuit; and traversing the conductive paths to detect metal-via extensions that protrude from the nodal features along a disjointed route from the nodal features, including:

locating a disconnected end along the disjointed route from at least one nodal feature of the nodal features, locating a turning point along the disjointed route between the at least one nodal feature and the disconnected end, and identifying the conductive path associated with the disjointed route as a metal-via extension.

17. The method of claim 16, wherein the conductive paths include wires, and wherein the nodal features include vias conjoined to the wires, and wherein the disconnected end refers to a convex u-shaped metal.

18. The method of claim 17, further comprising:

marking the convex u-shaped metal with a first highlighted indicator, and marking the turning point with a second highlighted indicator that is different than the first highlighted indicator.

19. The method of claim 18, further comprising:

displaying a visual representation of the integrated circuit to a user along with:

the nodal features that define the connective structure of the integrated circuit, the conductive paths in the physical layout of the integrated circuit, the first highlighted indicator that marks the convex u-shaped metal, and the second highlighted indicator that marks the turning point, wherein the second highlighted indicator is visually different than the first highlighted indicator.

20. The method of claim 16, wherein if a distance between the turning point and the at least one nodal feature is longer than an extension parameter, then the conductive path is associated with the disjointed route is identified as a redundant metal-via extension.

* * * * *